(12) United States Patent
Chang (10) Patent No.: US 12,550,500 B2
(45) Date of Patent: Feb. 10, 2026

(54) DISPLAY PANEL INCLUDING AN OPTICAL FILM HAVING A DEFECT ZONE

(71) Applicant: AUO Corporation, Hsin-Chu (TW)

(72) Inventor: Yu-Lun Chang, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 642 days.

(21) Appl. No.: 17/946,258

(22) Filed: Sep. 16, 2022

(65) Prior Publication Data

US 2023/0282788 A1 Sep. 7, 2023

(30) Foreign Application Priority Data

Mar. 2, 2022 (TW) .................................. 111107583

(51) Int. Cl.
*H10H 20/855* (2025.01)
*H01L 25/075* (2006.01)
*H10H 20/01* (2025.01)

(52) U.S. Cl.
CPC ....... *H10H 20/855* (2025.01); *H01L 25/0753* (2013.01); *H10H 20/0363* (2025.01)

(58) Field of Classification Search
CPC ............ H01L 25/0753; H10H 20/0363; G06F 1/18–189
USPC ..................................................... 257/59, 89
See application file for complete search history.

(56) References Cited

U.S. PATENT DOCUMENTS

| 2013/0003181 | A1* | 1/2013 | Hayashibe | G02B 1/118 359/585 |
|---|---|---|---|---|
| 2013/0342975 | A1 | 12/2013 | Kim | |
| 2015/0362650 | A1 | 12/2015 | Kim | |
| 2021/0132766 | A1* | 5/2021 | Lee | H10K 59/18 |
| 2022/0052219 | A1* | 2/2022 | Zhai | H10F 77/306 |
| 2023/0220534 | A1* | 7/2023 | Jang | C23C 14/042 118/504 |
| 2024/0170497 | A1* | 5/2024 | Gong | H10H 29/10 |

FOREIGN PATENT DOCUMENTS

| CN | 201876660 U | * | 6/2011 |
|---|---|---|---|
| CN | 111833758 A | | 10/2020 |
| CN | 111863886 A | | 10/2020 |
| CN | 113031331 A | | 6/2021 |
| TW | 201400878 A | | 1/2014 |
| TW | 201628846 A | | 8/2016 |

* cited by examiner

*Primary Examiner* — Eliseo Ramos Feliciano
*Assistant Examiner* — Mikka Liu
(74) *Attorney, Agent, or Firm* — WPAT, PC (57) ABSTRACT

A display panel includes a first display module, a first optical film, and a first optical adhesive. The first optical film is disposed on the first display module, and a sidewall of the first optical film is aligned with at least one sidewall of the first display module. The first optical adhesive is disposed along an edge of the first optical film, and the first optical adhesive at the edge covers an upper surface of the first optical film and a sidewall of the first optical film.

15 Claims, 5 Drawing Sheets

DISPLAY PANEL INCLUDING AN OPTICAL FILM HAVING A DEFECT ZONE

CROSS-REFERENCE TO RELATED APPLICATION

This application claims priority to Taiwan Application Serial Number 111107583, filed Mar. 2, 2022, which are herein incorporated by reference in its entirety.

BACKGROUND

Field of Invention

The present disclosure relates to a display panel.

Description of Related Art

As the technology of display panels gradually improves, display panel applications can be seen everywhere. Display panels may be formed by tiling multiple packages including light-emitting diodes together. The more packages that are tiled together, the larger the sizes of the display panel will become.

SUMMARY

Some embodiments of the present disclosure provide a display panel including a first display module, a first optical film, and a first optical adhesive. The first optical film is disposed on the first display module, and a sidewall of the first optical film is aligned with at least one sidewall of the first display module. The first optical adhesive is disposed along an edge of the first optical film, and the first optical adhesive at the edge covers an upper surface of the first optical film and a sidewall of the first optical film.

In one embodiment of the present disclosure, the first optical film includes a first sub-layer and a second sub-layer, the second sub-layer is on the first sub-layer, and the first optical adhesive is in contact with an upper surface of the first sub-layer of the first optical film and an upper edge of the sidewall of the first optical film.

In another embodiment of the present disclosure, the first optical film has a defect zone at the edge, and in the defect zone, and a portion of a plurality of microstructures of the first sub-layer is exposed from the second sub-layer.

In yet another embodiment of the present disclosure, in the defect zone, a sidewall of the second sub-layer is shifted inwards from a sidewall of the first sub-layer.

In yet another embodiment of the present disclosure, a reflective index of the second sub-layer is lower than a reflective index of the first sub-layer.

In yet another embodiment of the present disclosure, the display panel further includes a third sub-layer on the second sub-layer.

In yet another embodiment of the present disclosure, the first display module includes a first substrate, a first display element and a first protection film. The first display element is disposed on the first substrate. The first protection film covers an upper surface and an upper portion of a sidewall of the first substrate.

In yet another embodiment of the present disclosure, the first optical film further covers a junction between the first optical film and the first protection film.

In yet another embodiment of the present disclosure, the sidewall of the first optical film is aligned with a sidewall of the first protection film.

In yet another embodiment of the present disclosure, the display panel further includes a second display module, a second optical film and a second optical adhesive. The second display module is adjacent to the first display module. The second optical film is disposed on the second display module and in contact the second display module. The second optical adhesive covers an outer edge of an upper surface and an upper edge of a sidewall of the second optical film, and the second optical adhesive is in contact with the first optical adhesive.

Additional embodiments of the present disclosure provide a display panel including a first display module, a first optical film and a first optical adhesive. The first optical film is disposed on the first display module, and the first optical film has a defect zone at an edge of the first optical film. The first optical adhesive is disposed along an edge of the first optical film and covers the defect zone.

In yet another embodiment of the present disclosure, optical properties of the defect zone are different from optical properties of a non-defect zone of the first optical film.

In yet another embodiment of the present disclosure, the first optical film comprises a first sub-layer, a second sub-layer and a third sub-layer, the third sub-layer is on the second sub-layer, and the second sub-layer is on the first sub-layer, and the first optical adhesive is in contact with an upper surface of the first sub-layer of the first optical film and an upper edge of the sidewall of the first optical film.

In yet another embodiment of the present disclosure, the first optical adhesive is further in contact with an upper surface of the second sub-layer of the first optical film.

In yet another embodiment of the present disclosure, in the defect zone, a sidewall of the third sub-layer is shifted inwards from a sidewall of the second sub-layer, and a sidewall of the second sub-layer is shifted inwards from a sidewall of the first sub-layer.

In yet another embodiment of the present disclosure, the first optical adhesive is made of dark-colored photoresist.

An additional embodiment of the present disclosure provides a manufacturing method of a display panel, including forming a plurality of first packages, and tiling the first packages together. Each of the first packages includes a first display module, a first optical film, and a first optical adhesive. The first optical film is disposed on the first display module, and a sidewall of the first optical film is aligned with at least one sidewall of the first display module. The first optical adhesive is disposed along an edge of the first optical film, and the first optical adhesive at the edge covers an upper surface of the first optical film and a sidewall of the first optical film.

In yet another embodiment of the present disclosure, forming one of the first packages including disposing the first optical film on the first display module. The first display module includes a first substrate, a first display element disposed on the first substrate, and a first protection film covering an upper surface and an upper portion of a sidewall of the first substrate. A portion of the first protection film and the first optical film are cut. The first optical adhesive is disposed along an edge of the first optical film to cover the defect zone.

In yet another embodiment of the present disclosure, after tiling the first packages together, the second optical adhesive is in contact with the first optical adhesive.

In yet another embodiment of the present disclosure, disposing the first optical adhesive along an edge of the first optical film to cover the defect zone comprises using a pad printing technique.

In yet another embodiment of the present disclosure, the optical adhesive used in some embodiments of the present disclosure covers the defect zone of the optical film. When different packages are tiled together, it is not easy for the users to perceive the existence of the slicing region between the packages, such that tiled packages may form a larger display panel.

It is to be understood that both the foregoing general description and the following detailed description are by examples, and are intended to provide further explanation of the invention as claimed. It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure are related to display panels having an optical adhesive. The optical adhesive is disposed at a defect zone of an optical film of the display panel, and is used to cover the defect zone of the optical film. As such, when different display modules are tiled together, the optical adhesive covers surface defects at slicing regions. When using the display panels in some embodiments of the present disclosure, it is not easy for the users to perceive the existence of the defect zone near the splicing regions.

Figure 1:
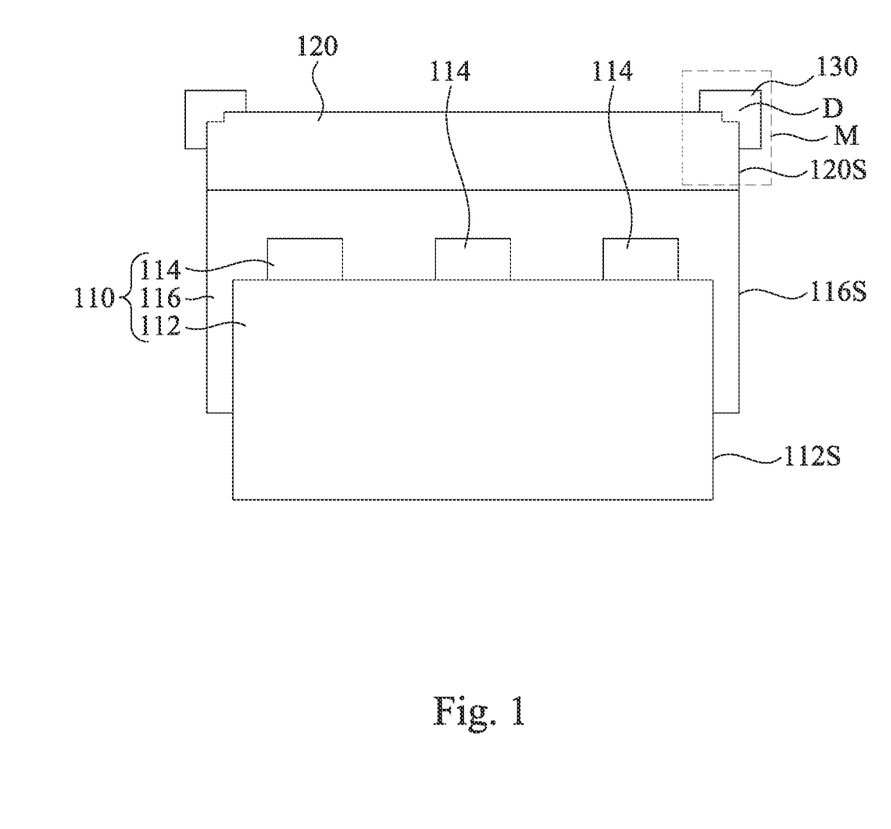
FIG. 1 illustrates a cross-section view of a first package in some embodiments of the present disclosure.

FIG. 1 illustrates a cross-section view of a first package 100 in some embodiments of the present disclosure. The first package 100 includes a first display module 110, a first optical film 120 and a first optical adhesive 130. The first display module 110 may be in any form. In some embodiments, the first display module 110 includes a first substrate 112, first display elements 114 and a first protection film 116. In some embodiments, the first substrate 112 may be made of any suitable materials, such as glass. The first display elements 114 are disposed on the first substrate 112. In some embodiments, the first display elements 114 may be light-emitting diode chips, etc., and the number of the first display elements 114 may be one or multiple, such as 3. The first protection film 116 covers an upper surface and an upper portion of a sidewall of the first substrate 112 to protect metal wirings at the side of the first substrate 112. The first protection film 116 also covers the first display elements 114 to prevent the first display elements 114 from damage. The first protection film 116 may be an encapsulation layer. For example, the first protection film 116 may be made of epoxy, silica gel or other materials.

The first optical film 120 is disposed on the first display module 110, and a sidewall of the first optical film 120 is aligned with at least one sidewall of the first display module 110. The first optical film 120 may be a multilayer structure, and has anti-glare, anti-reflection, anti-fingerprint functions. In some embodiments, after the first protection film 116 and the first optical film 120 are disposed on the first substrate 112, a portion of the first protection film 116 and a portion of the first optical film 120 are cut, such that a horizontal distance is between the sidewall 116S of the first protection film 116 (or the sidewall 120S of the first optical film 120) and the sidewall 112S of the first substrate 112. In some embodiments, the horizontal distance is designed to make the pitch between the first display elements 114 on the different first substrate 112 and the pitch between the first display elements 114 on the same display elements 114 the same. As such, after tiling different first package 100, it is not easy for the users to perceive the existence of the splicing regions between the first packages 100. The tiled first packages 100 form a larger panel visually. The first optical film 120 and the first protection film 116 may be cut at the same time, so the sidewall 120S of the first optical film 120 is aligned with the sidewall 116S of the first protection film 116.

Figure 2A:
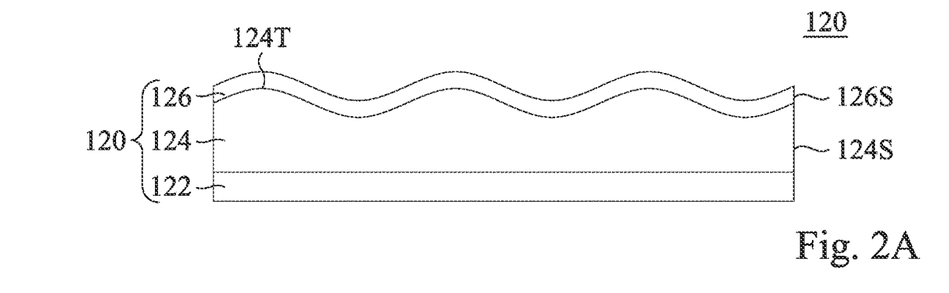
FIG. 2A illustrates a cross-section view of the first optical film in some embodiments of the disclosure.
Figure 2B:
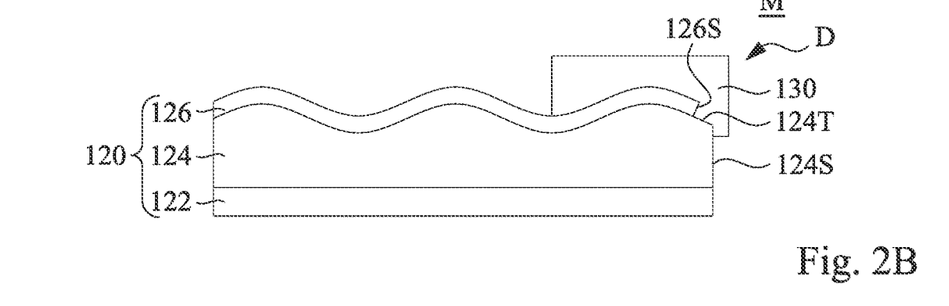
FIG. 2B and FIG. 2C illustrate enlargement views of region M in FIG. 1 in various embodiments.
Figure 2C:
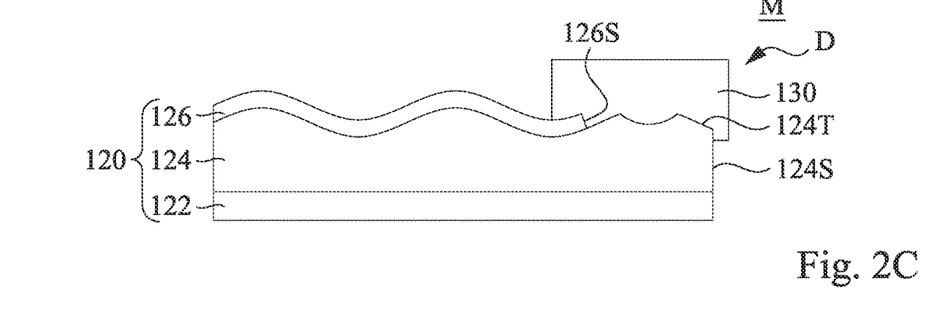

When cutting the first protection film 116 and the first optical film 120, a defect zone D may form at the edge of the first optical film 120. In particular, the defect zone D may be heat affected zone (HAZ), where heat generated during the cutting process (such as laser cutting) damages the material structure near the cutting region. FIG. 2A illustrates a cross-section view of the first optical film 120 in some embodiments of the disclosure. FIG. 2B and FIG. 2C illustrate enlargement views of region M in FIG. 1 in various embodiments, and the enlargement views illustrate cross-section views of the first optical film 120 after cutting. It is noted that, FIG. 2A only illustrates the first optical film 120 in the region M before cutting. In some embodiments, the first optical film 120 may include a bottom layer 122, a first sub-layer 124 and a second sub-layer 126. The second sub-layer 126 is on the first sub-layer 124, and the first sub-layer 124 is on the bottom layer 122. In some embodiments, the first sub-layer 124 may be an anti-glare film, and the upper surface 124T may have microstructures to reduce glare resulting from reflection from the first display module 110. The second sub-layer 126 is a conformal layer on the first sub-layer 124. Therefore, the second sub-layer 126 also has a concave-convex surface. In some embodiments, the second sub-layer 126 may be an anti-reflection layer. Therefore, a reflective index of the second sub-layer 126 is lower than a reflective index of the first sub-layer 124. Before cutting the first optical film 120, the sidewall 124S of the first sub-layer 124 is substantially aligned with the sidewall 126S of the second sub-layer 126. During cutting the first optical film 120, the defect zone D is formed near the cutting region. In the defect zone D, since the cutting surface is not smooth or the layers in the first optical film 120 partially peel, the optical properties of the defect zone D are different from the optical properties of the non-defect zone of the first optical film 120. The defect zone D and the non-defect zone of the first optical film 120 also present different colors. For example, as shown in FIG. 2B, in the defect zone D, the sidewall 126S of the second sub-layer 126 is shifted inwards from a sidewall 124S of the first sub-layer 124, such that the upper surface 124T of the first sub-layer 124 underlying is exposed. Moreover, as shown in FIG. 2C, a portion of the microstructures of the first sub-layer 124 may also be damaged, such that a portion of the microstructures of the first sub-layer 124 is exposed from the second sub-layer 126. The convex portion of the microstructures of the first sub-layer 124 may also become concave. The optical properties (such as reflective index) of first sub-layer 124 and the second sub-layer 126 are different. The first sub-layer 124 exposed in the defect zone D or the damaged microstructures cause that the defect zone D and the non-defect zone of the first optical film 120 present different colors. For example, the ant-reflection layer or the microstructures in the defect zone D are damaged, such that the defect zone D reflects more light and present brighter color.

Figure 3A:
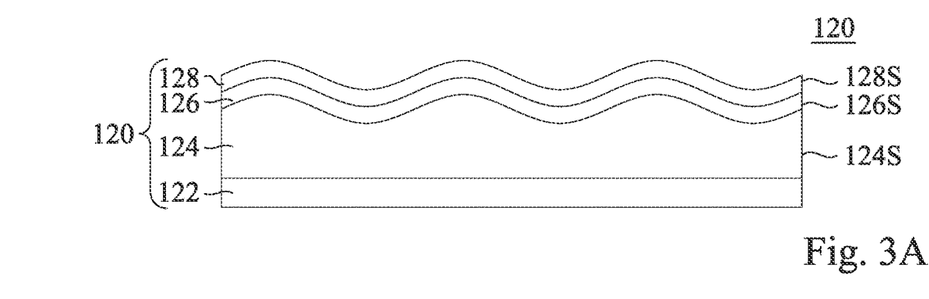
FIG. 3A illustrates a cross-section view of the first optical film in some other embodiments of the disclosure.
Figure 3B:
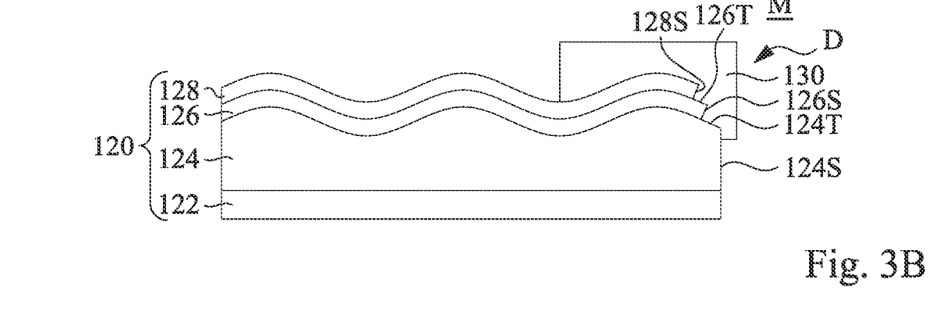
FIG. 3B and FIG. 3C illustrate enlargement views of region M in FIG. 1 in various embodiments.
Figure 3C:
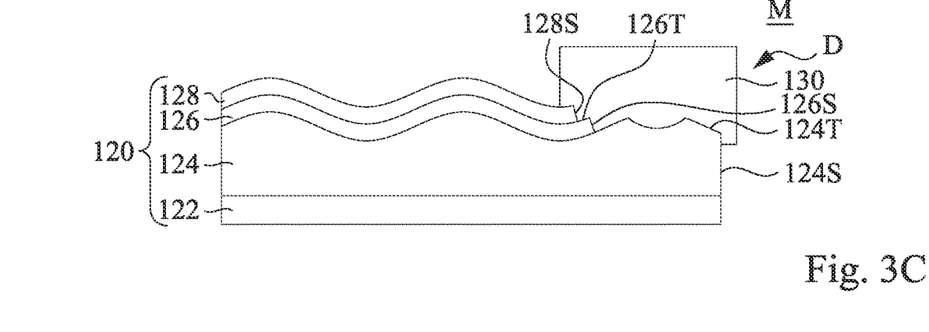

FIG. 3A illustrates a cross-section view of the first optical film 120 in some other embodiments of the disclosure. FIG. 3B and FIG. 3C illustrate enlargement views of region M in FIG. 1 in various embodiments, and the enlargement views illustrate cross-section views of the first optical film 120 after cutting. It is noted that, FIG. 3A only illustrates the first optical film 120 in the region M before cutting. In FIG. 3A, the first optical film 120 further includes a third sub-layer 128. The third sub-layer 128 is a conformal layer on the second sub-layer 126, and the third sub-layer 128 may be an anti-fingerprint layer, so that fingerprints are difficult to leave on the display panels. Before cutting the first optical film 120, the sidewall 124S of the first sub-layer 124, the sidewall 126S of the second sub-layer 126 and the sidewall 128S of the third sub-layer 128 are substantially aligned with each other. During cutting the first optical film 120, the defect zone D is formed near the cutting region. As shown in FIG. 3B, in the defect zone D, the sidewall 128S of the third sub-layer 128 is shifted inwards from the sidewall 126S of the second sub-layer 126, the sidewall 126S of the second sub-layer 126 is shifted inwards from the sidewall 124S of the first sub-layer 124, such that the upper surface 126T of the second sub-layer 126 underlying and the upper surface 124T of the first sub-layer 124 underlying are exposed. Moreover, as shown in FIG. 3C, a portion of the microstructures of the first sub-layer 124 may also be damaged, such that a portion of the microstructures of the first sub-layer 124 is exposed from the second sub-layer 126 and the third sub-layer 128. It is noted that although FIGS. 2A-3C illustrate the number of the sub-layers of the first optical film 120 is 2 or 3, the number of the sub-layers of the first optical film 120 may be greater or equal to 3. The present disclosure is not limited thereto.

Although FIGS. 2A-3C illustrate that the first optical film 120 has the microstructures; on the other hand, the first optical film 120 may not have the microstructures. In some embodiments, the first sub-layer 124, the second sub-layer 126 and the third sub-layer 128 (if presented) are all planar layers, and sub-layers of the first optical film 120 may have different optical properties (such as reflective index and refractive index). When cutting the first optical film 120, the cutting region is not smooth, such that upper surfaces of different sub-layers are exposed. Different optical properties of each sub-layers lead to the visual difference between the defect zone D and the non-defect zone. Therefore, in this embodiment, the defect zone D is still formed at the edge of the first optical film 120.

Please refer again to FIG. 1 with FIG. 2B, FIG. 2C, FIG. 3B, and FIG. 3C, the first optical adhesive 130 is disposed along the edge of the first optical film 120, and the first optical adhesive 130 at the edge covers the upper surface of the first optical film 120 and the sidewall of the first optical film 120. The first optical adhesive 130 entirely covers the defect zone D, such that the defect zone D is not exposed. Since the defect zone D may be formed on the upper surface (such as FIG. 2C and FIG. 3C) and the sidewall (such as FIG. 2B and FIG. 3B) of the first optical film 120 during cutting the first optical film 120, the first optical adhesive 130 may be in contact with the upper surface 124T of the first sub-layer 124 (or upper surface 126T of the second sub-layer 126) of the first optical film 120 and the upper edge of the sidewall 120S of the first optical film 120 to cover the defect zone D. Since the thickness of the second sub-layer 126 (and third sub-layer 128 if presented) are small, when the first optical adhesive 130 is in contact the upper edge of the sidewall 120S of the first optical film 120, the first optical adhesive 130 is in contact with the sidewall 124S of the first sub-layer 124 and the sidewall 126S of the second sub-layer 126 (and the sidewall 128S of the third sub-layer 128 if presented). In some embodiments, the first optical adhesive 130 may be strip-shaped to entirely cover the edge of the first optical film 120. In some embodiments, a pad printing technique may be used to cover the first optical adhesive 130 on the defect zone D.

The first optical adhesive 130 may be made of dark-colored photoresist to prevent metal reflection, and the optical density (OD) value and the color of the first optical adhesive 130 are similar to those of the first protection film 116. In some embodiments, the first optical adhesive 130 and the first protection film 116 are made of similar or same materials. In some embodiments, the first optical adhesive 130 is made of a polymer material. When the first optical adhesive 130 covers the defect zone D, it is not easy for the users to perceive the existence of the defect zone D. The first optical adhesive 130 may be chosen based on other characteristics, such as adhesion, wear resistance, or temperature tolerance. For example, the first optical adhesive 130 has proper adhesion to adhere to first optical film 120. The first optical adhesive 130 has proper anti-collision ability or wear resistance, such that the first optical adhesive 130 will not be worn out when tiling the first package 100 subsequently. The first optical adhesive 130 has proper temperature tolerance, such that the fluidity of the first optical adhesive 130 will not change due to high temperature in subsequent processes (such as high-temperature testing).

Figure 4:
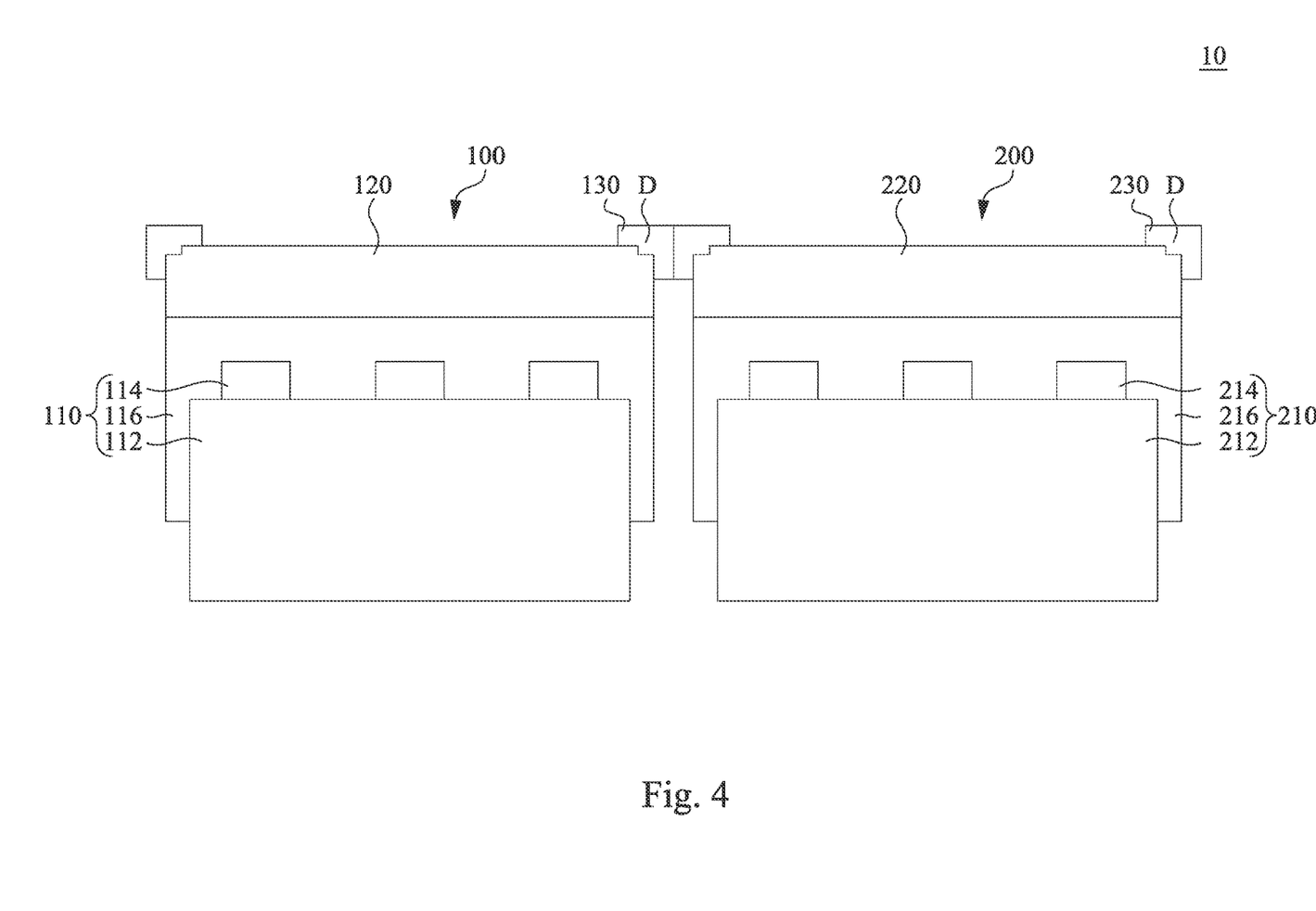
FIG. 4 illustrates a cross-section view of a display panel in some embodiments of the present disclosure.

FIG. 4 illustrates a cross-section view of the display panel 10 in some embodiments of the present disclosure. After forming the first optical adhesive 130 at the edge of the first optical film 120, the first package 100 and a second package 200 are tiled together. The second package 200 may be similar to or same as the first package 100. The second package 200 includes a second display module 210, a second optical film 220 and a second optical adhesive 230, and the second display module 210 may include a second substrate 212, second display elements 214 and a second protection film 216. The second display module 210 is adjacent to the first display module 110. The second optical film 220 is disposed on the second display module 210 and is in contact with the second display module 210. The second optical adhesive 230 covers an outer edge of an upper surface and an upper edge of a sidewall of the second optical film 220. The second display module 210 (such as second substrate 212, second display elements 214 and second protection film 216), the second optical film 220 and the second optical adhesive 230 may be similar to or same as the first display module 110, the first optical film 120 and the first optical adhesive 130 respectively. The details are not repeatedly described herein.

When the first package 100 and the second package 200 are tiled together, the second optical adhesive 230 is in contact with the first optical adhesive 130, and the first optical film 120 is not contact with the second optical film 220, the first protection film 116 may not in contact with the second protection film 216. The second optical adhesive 230 and the first optical adhesive 130 have wear resistance to a certain extent to prevent collision, such that the second optical adhesive 230 and the first optical adhesive 130 will not be worn out during tiling. The first optical adhesive 130 and the second optical adhesive 230 are disposed before tiling, so the first optical adhesive 130 and the second optical adhesive 230 are also formed at the outer edges of the upper surfaces and the upper edges of the sidewalls of the first optical film 120 and the second optical film 220 to cover the defect zone D. Accordingly, it is not easy for the users to perceive the existence of the slicing region between the first optical film 120 and the second optical film 220. It is noted that although FIG. 4 only illustrates that there are two packages in the display panel 10, the display panel 10 may include more first package 100 or second package 200, and may be arranged in a one-dimensional or a two-dimensional array.

Figure 5:
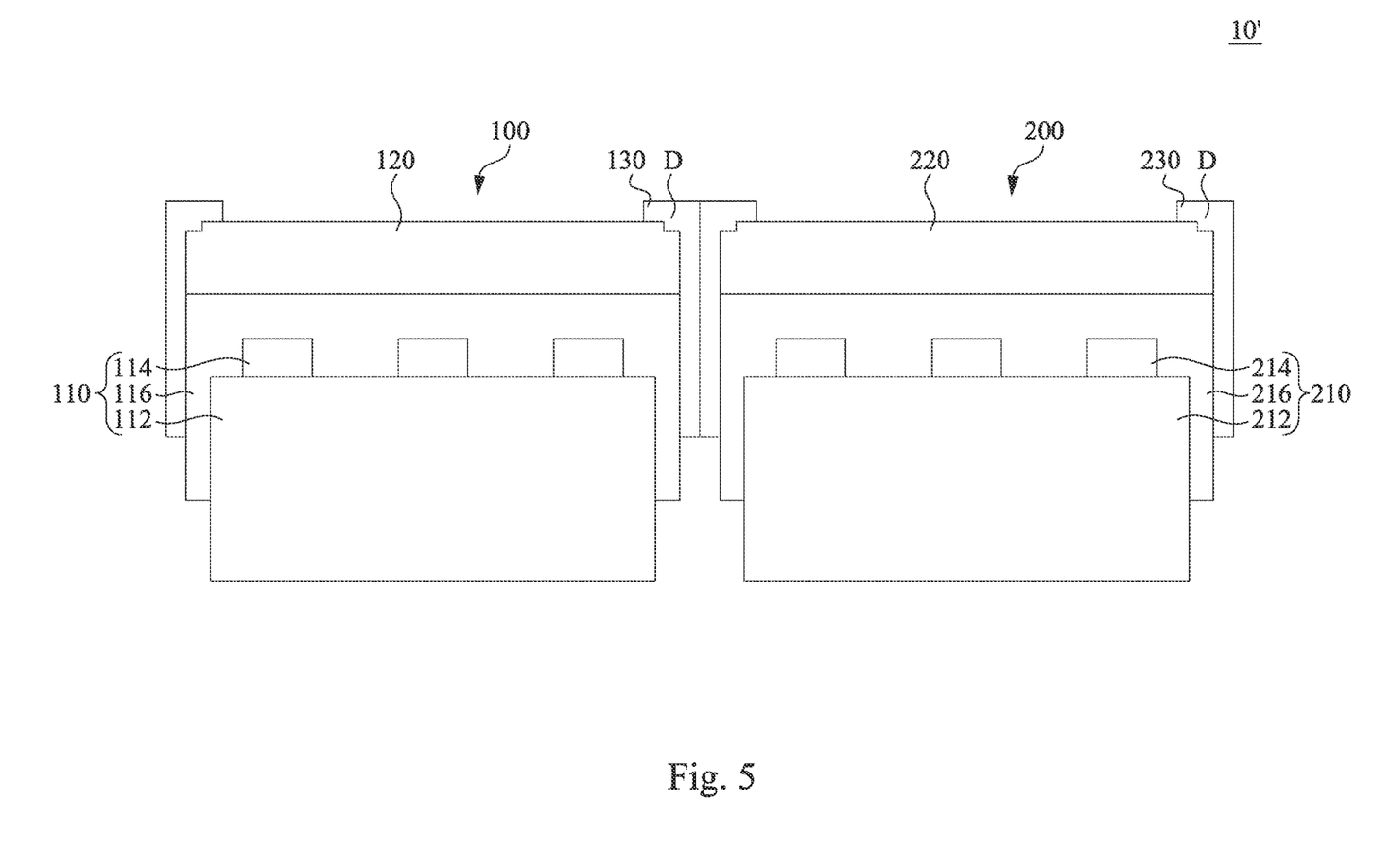
FIG. 5 illustrates a cross-section view of a display panel in some other embodiments of the present disclosure.

FIG. 5 illustrates a cross-section view of the display panel 10' in some other embodiments of the present disclosure. The display panel 10' is similar to the display panel 10 in FIG. 4. The difference is that in the display panel 10', the first optical adhesive 130 further covers the junction between the first optical film 120 and the first protection film 116, and the second optical adhesive 230 further covers the junction between the second optical film 220 and the second protection film 216. As such, the first optical adhesive 130 may prevent foreign substances (such as vapor) from entering the first package 100 from the junction of the first optical film 120 and the first protection film 116, and the second optical adhesive 230 may prevent foreign substances (such as vapor) from entering the second package 200 from the junction of the second optical film 220 and the second protection film 216.

As mentioned above, some embodiments of the present disclosure provides some advantages. In particular, the optical adhesive of some embodiments of the present disclosure covers the defect zone of the optical film. When different packages are tiled together, it is not easy for the users to perceive the existence of the slicing region between the packages, such that tiled packages may form a larger display panel.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display panel, comprising:
   a first display module;
   a first optical film disposed on the first display module, wherein a sidewall of the first optical film is aligned with at least one sidewall of the first display module, the first optical film comprises a first sub-layer and a second sub-layer, the second sub-layer is on the first sub-layer; and
   a first optical adhesive disposed along an edge of the first optical film, wherein the first optical adhesive at the edge covers an upper surface of the first optical film and the sidewall of the first optical film, the first optical adhesive is in contact with an upper surface of the first sub-layer of the first optical film and an upper edge of the sidewall of the first optical film, and the first optical film has a defect zone at the edge, and in the defect zone, a portion of a plurality of microstructures of the first sub-layer is exposed from the second sub-layer.

2. The display panel of claim 1, wherein in the defect zone, a sidewall of the second sub-layer is shifted inwards from a sidewall of the first sub-layer.

3. The display panel of claim 1, wherein a reflective index of the second sub-layer is lower than a reflective index of the first sub-layer.

4. The display panel of claim 1, further comprising:
   a third sub-layer on the second sub-layer.

5. The display panel of claim 1, wherein the first display module comprises:
   a first substrate;
   a first display element disposed on the first substrate; and
   a first protection film covering an upper surface and an upper portion of a sidewall of the first substrate.

6. The display panel of claim 5, wherein the first optical film further cover a junction between the first optical film and the first protection film.

7. The display panel of claim 5, wherein the sidewall of the first optical film is aligned with a sidewall of the first protection film.

8. The display panel of claim 1, further comprising:
   a second display module adjacent to the first display module; and
   a second optical film disposed on the second display module and in contact w the second display module; and
   a second optical adhesive covering an outer edge of an upper surface and an upper edge of a sidewall of the second optical film, wherein the second optical adhesive is in contact with the first optical adhesive.

9. A display panel, comprising:
a first display module;
a first optical film disposed on the first display module, wherein the first optical film has a defect zone at an edge of the first optical film, the first optical film comprises a first sub-layer and a second sub-layer, the second sub-layer is on the first sub-layer; and
a first optical adhesive disposed along the edge of the first optical film and covering the defect zone, and the first optical adhesive is in contact with an upper surface of the first sub-layer of the first optical film and an upper edge of a sidewall of the first optical film, and in the defect zone, a portion of a plurality of microstructures of the first sub-layer is exposed from the second sub-layer.

10. The display panel of claim 9, wherein optical properties of the defect zone are different from optical properties of a non-defect zone of the first optical film.

11. The display panel of claim 9, wherein the first optical film further comprises a third sub-layer, the third sub-layer is on the second sub-layer.

12. The display panel of claim 11, wherein the first optical adhesive is further in contact with an upper surface of the second sub-layer of the first optical film.

13. The display panel of claim 11, wherein in the defect zone, a sidewall of the third sub-layer is shifted inwards from a sidewall of the second sub-layer, and a sidewall of the second sub-layer is shifted inwards from a sidewall of the first sub-layer.

14. The display panel of claim 11, wherein a reflective index of the second sub-layer is lower than a reflective index of the first sub-layer.

15. The display panel of claim 9, wherein the first optical adhesive is made of dark-colored photoresist.

* * * * *